(12) United States Patent
Yang et al.

(10) Patent No.: US 12,550,273 B2
(45) Date of Patent: Feb. 10, 2026

(54) DISPLAY PANEL, SPLICING SCREEN, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Yang, Beijing (CN); Liqiang Chen, Beijing (CN); Wenliang Liu, Beijing (CN); Shengxing Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 264 days.

(21) Appl. No.: 18/271,747

(22) PCT Filed: Jul. 14, 2022

(86) PCT No.: PCT/CN2022/105704
§ 371 (c)(1),
(2) Date: Jul. 11, 2023

(87) PCT Pub. No.: WO2024/011498
PCT Pub. Date: Jan. 18, 2024

(65) Prior Publication Data
US 2024/0397646 A1 Nov. 28, 2024

(51) Int. Cl.
*H05K 5/02* (2006.01)
*H05K 5/04* (2006.01)
*H05K 5/30* (2025.01)

(52) U.S. Cl.
CPC .............. *H05K 5/0217* (2013.01); *H05K 5/04* (2013.01); *H05K 5/30* (2025.01)

(58) Field of Classification Search
CPC ...... H05K 5/0017; H05K 5/0217; H05K 5/30; H05K 5/04
(Continued)

(56) References Cited

U.S. PATENT DOCUMENTS 6,597,416 B1 * 7/2003 Momose ................ H05K 3/365
349/149
9,568,788 B2 * 2/2017 Shibahara ............ G02F 1/13452
(Continued)

FOREIGN PATENT DOCUMENTS

CN 102914890 B 6/2017
CN 109065589 A 12/2018
(Continued)

*Primary Examiner* — Hung S. Bui
(74) *Attorney, Agent, or Firm* — WHDA, LLP; John P. Kong (57) ABSTRACT

The present disclosure provides a display panel, a splicing screen, and a display device. The display panel includes: a display substrate, the display substrate including a display region and a non-display region surrounding the display region, the non-display region including a binding region, and a bending region arranged between the display region and the binding region; and a support arranged at a backlight side of the display substrate. The support includes, along a light-exiting direction of the display substrate, a first surface, a second surface and a first lateral surface, the first lateral surface is an oblique surface, an angle between the first lateral surface and the first surface is an acute angle, and an angle between the first lateral surface and the second surface is an obtuse angle.

20 Claims, 6 Drawing Sheets

(58) Field of Classification Search
USPC ......................................................... 361/807
See application file for complete search history.

(56) References Cited

U.S. PATENT DOCUMENTS

| | | | | |
|---|---|---|---|---|
| 2008/0198289 | A1* | 8/2008 | Oohira | G02F 1/133308 |
| | | | | 349/46 |
| 2009/0213292 | A1* | 8/2009 | Park | H10K 59/87 |
| | | | | 349/58 |
| 2010/0315570 | A1* | 12/2010 | Mathew | G06F 1/1658 |
| | | | | 349/56 |
| 2014/0307396 | A1* | 10/2014 | Lee | G02F 1/133305 |
| | | | | 29/830 |
| 2015/0036300 | A1 | 2/2015 | Park et al. | |
| 2016/0174304 | A1 | 6/2016 | Kim et al. | |
| 2020/0214137 | A1 | 7/2020 | Huang et al. | |
| 2021/0325711 | A1* | 10/2021 | Choi | G02F 1/133334 |
| 2022/0052290 | A1 | 2/2022 | Zhu | |

FOREIGN PATENT DOCUMENTS

| | | | | | |
|---|---|---|---|---|---|
| CN | 109147564 | A | | 1/2019 | |
| CN | 107006088 | B | | 9/2019 | |
| CN | 110610904 | A | | 12/2019 | |
| CN | 107464878 | B | | 3/2020 | |
| CN | 112863346 | A | | 5/2021 | |
| CN | 113363297 | A | | 9/2021 | |
| CN | 109541834 | B | | 11/2021 | |
| JP | 2008112070 | A | * | 5/2008 | ............... G09F 9/00 |
| KR | 20080001511 | A | | 1/2008 | |
| KR | 20110051611 | A | * | 11/2009 | ............. H01L 51/50 |
| WO | WO-2016035489 | A1 | * | 3/2016 | ........... G02F 1/1333 |

* cited by examiner

DISPLAY PANEL, SPLICING SCREEN, AND DISPLAY DEVICE

CROSS-REFERENCE TO RELATED APPLICATION

The present application is the U.S. national phase of PCT Application No. PCT/CN2022/105704 filed on Jul. 14, 2022, which is incorporated herein by reference in its entirety.

TECHNICAL FIELD

The present disclosure relates to the manufacture of a display product, in particular to a display panel, a splicing screen, and a display device.

BACKGROUND

Currently, a flexible display technology has been widely used in mobile phones, notebook computers and vehicle displays. However, there still exists a challenge in a large-size splicing screen. For example, when a binding region of a display panel is bent to a backlight side, a rebound force is generated due to a bending stress, and thereby a damage easily occurs.

SUMMARY

An object of the present disclosure is to provide a display panel, a splicing screen and a display device, so as to reduce a stress in a bending region, thereby to prevent the occurrence of the damage.

In one aspect, the present disclosure provides in some embodiments a display panel, including: a display substrate, the display substrate including a display region and a non-display region surrounding the display region, the non-display region including a binding region and a bending region arranged between the display region and the binding region; and a support arranged at a backlight side of the display substrate. The support includes, along a light-exiting direction of the display substrate, a first surface, a second surface arranged opposite to the first surface, and a first lateral surface arranged between the first surface and the second surface, the first surface is arranged close to the display region, the first lateral surface is covered by the bending region, the first lateral surface is an oblique surface, an angle between the first lateral surface and the first surface is an acute angle, and an angle between the first lateral surface and the second surface is an obtuse angle.

In a possible embodiment of the present disclosure, along a bending direction of the bending region, the bending region includes an arc-shaped surface portion arranged close to the display region and a beveled surface portion adjacent to the arc-shaped surface portion, and the beveled surface portion is attached to the first lateral surface.

In a possible embodiment of the present disclosure, a radius of the arc-shaped surface portion is less than or equal to 0.14 mm.

In a possible embodiment of the present disclosure, a first back film is arranged between the display substrate and the first surface, a distance between a lateral surface of the first back film close to the bending region and a side of the first surface close to the bending region in a first direction is greater than or equal to the radius of the arc-shaped surface portion, the first direction is a direction from the display region to the binding region, and the first direction is parallel to the display region.

In a possible embodiment of the present disclosure, a corner formed by the first lateral surface and the first surface is a rounded corner.

In a possible embodiment of the present disclosure, a corner formed by the first lateral surface and the second surface is a rounded corner.

In a possible embodiment of the present disclosure, a corner formed by the first lateral surface and the first surface is a first rounded corner, a corner formed by the first lateral surface and the second surface is a second rounded corner, and a radius of the first rounded corner is smaller than a radius of the second rounded corner.

In a possible embodiment of the present disclosure, a transition region is arranged between the bending region and the binding region along a bending direction of the bending region, the transition region is provided with an arc-shaped surface, and a bending radius of the transition region is equal to a radius of the rounded corner formed by the first lateral surface and the second surface.

In a possible embodiment of the present disclosure, an angle between the first surface and the first lateral surface is 30° to 60°.

In a possible embodiment of the present disclosure, the non-display region further includes a first region arranged at a side of the display region away from the binding region, and a second region and a third region arranged adjacent to the first region, and at least one of the first region, the second region and the third region includes a first sub-region exposed at a corresponding edge of the display panel.

In a possible embodiment of the present disclosure, a width of the first sub-region is 0.02 mm to 0.04 mm in a direction perpendicular to an extension direction of a corresponding one of the first region, the second region, and the third region.

In a possible embodiment of the present disclosure, a cover plate is arranged at the light-exiting side of the display substrate, a frame sealant is arranged on the first sub-region, and a surface of the frame sealant away from the first sub-region is flush with a surface of the cover plate away from the display substrate.

In a possible embodiment of the present disclosure, an edge sealant is arranged between the bending region and the cover plate, a side of the edge sealant away from the display region is flush with a corresponding lateral surface of the cover plate along a first direction, the first direction is a direction from the display region to the binding region, and the first direction is parallel to the display region.

In a possible embodiment of the present disclosure, a groove for receiving a circuit board is formed in the second surface at a side away from the first surface, and the display substrate is coupled to the circuit board via a flexible circuit board.

In a possible embodiment of the present disclosure, a depth of the groove is less than a thickness of the circuit board in the light-exiting direction of the display substrate so that a part of the circuit board is exposed to the support.

In a possible embodiment of the present disclosure, the support is made of an aluminum plate.

In another aspect, the present disclosure provides in some embodiments a splicing screen including a plurality of the above-mentioned display panels spliced together. Each display panel includes a display substrate, the display substrate is coupled to a circuit board via a flexible circuit board, and pins coupled to a main circuit board of the splicing screen are formed on the circuit board of the display panel.

In yet another aspect, the present disclosure provides in some embodiments a display device including the above-mentioned display panel or the above-mentioned splicing panel.

The present disclosure has the following beneficial effects. The lateral surface of the support corresponding to the bending region is an oblique surface, so as to reduce an area of a hollowed-out region at the bending region, i.e., reduce a space between the bending region and the support. As a result, through the oblique surface, it is able to reduce a bending stress of the binding region, thereby to reduce the damage caused by a rebound force.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

Figure 1:
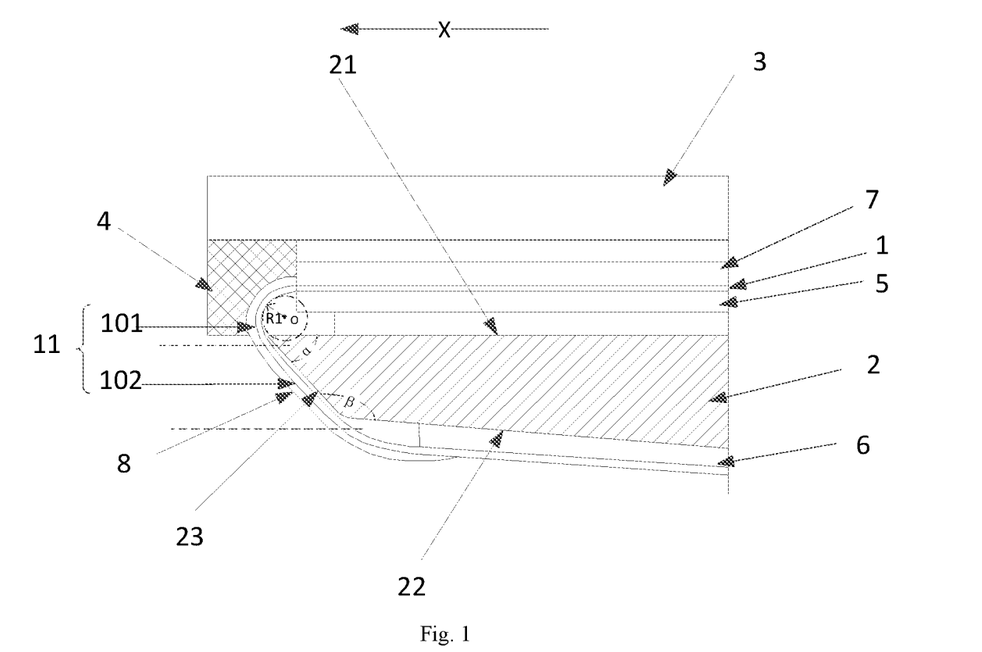
FIG. 1 is a schematic view of a display panel according to one embodiment of the present disclosure.

Referring to FIGS. 1 to 14, the present disclosure provides in some embodiments a display panel, which includes: a display substrate 1, the display substrate 1 including a display region 12 and a non-display region surrounding the display region 12, the non-display region including a binding region 131 and a bending region 11 provided between the display region 12 and the binding region 131; and a support 2 arranged at a backlight side of the display substrate 1. The support 2 includes, along a light-exiting direction of the display substrate 1, a first surface 21, a second surface 22 arranged opposite to the first surface 21, and a first lateral surface 23 arranged between the first surface 21 and the second surface 22, the first surface 21 is arranged close to the display region 12, the first lateral surface 23 is covered by the bending region 11, the first lateral surface 23 is an oblique surface, an angle α between the first lateral surface 23 and the first surface 21 is an acute angle, and an angle β between the first lateral surface 23 and the second surface 22 is an obtuse angle (as shown in FIG. 1).

In the embodiments of the present disclosure, a first back film 5 is coupled to a side of the first surface 21 of the support away from the second surface 22 via an optical clear adhesive layer, and a second back film 6 is arranged on a side of the second surface 22 of the support away from the first surface 21. A polarizer 7 is attached to a light-exiting side of the display substrate, a cover plate 3 is attached to a side of the polarizer 7 away from the display substrate 1 via an optical clear adhesive layer, and a protection adhesive layer 8 is arranged on a side of the bending region 11 away from the support.

In the related art, in the light-exiting direction of the display substrate, a cross-sectional shape of the support 2 is rectangular, the bending region 11 is bent to a side of the support 2 away from the display substrate 1, and under the effect of a bending stress, the bending region 11 is easily damaged (e.g., separated from the protection adhesive layer 8, or cracked) due to a rebound force. In order to solve this problem, in the embodiments of the present disclosure, the first lateral surface 23 is an oblique surface arranged obliquely from the first surface 21 to the second surface 22, so as to reduce an area of a hollowed-out region between the binding region 131 of the display substrate 1 and the support 2, and enable the bending region 11 to be attached onto the first lateral surface 23 as possible. As a result, it is able to reduce a rebound force of the bending region 11, thereby to prevent the bending region 11 from being damaged.

It should be appreciated that, the non-display region generally surrounds the display region. For example, it includes an upper region, a lower region, a left region and a right region of the display panel. In some embodiments of the present disclosure, the binding region is located at the lower region for binding an integrated circuit (IC), and the bending region is used to bend the binding region to a back surface of the display panel, so as to provide the display panel with a narrow bezel.

Illustratively, along a bending direction of the bending region 11 (as indicated by a curved arrow in FIG. 2), the bending region 11 includes an arc-shaped surface portion 101 arranged close to the display region 12 and a beveled surface portion 102 adjacent to the arc-shaped surface portion, and the beveled surface portion 102 is attached to the first lateral surface 23.

Figure 2:
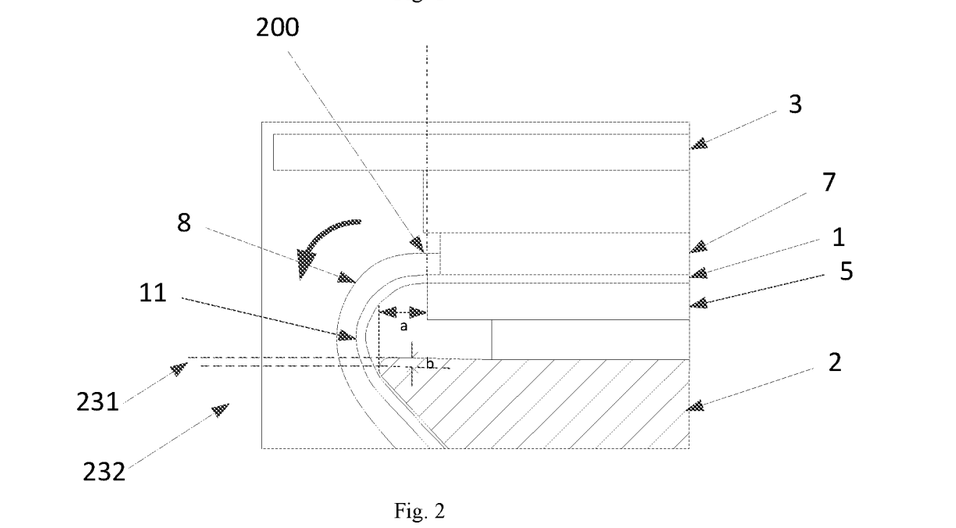
FIG. 2 is a partially enlarged view of the display panel according to one embodiment of the present disclosure.

Illustratively, the beveled surface portion 102 is secured to the first lateral surface 23 through an adhesive layer, so as to ensure an overall shape of the bending region 11, thereby to prevent the bending region 11 from being damaged due to the rebound force.

Referring to FIG. 1, in a possible embodiment of the present disclosure, a radius R1 of the arc-shaped surface portion 101 is less than or equal to 0.14 mm. For example, in one embodiment, the radius of the arc-shaped surface portion 101 is 0.14 mm.

Referring to FIG. 2, in a possible embodiment of the present disclosure, a first back film 5 is arranged between the display substrate 1 and the first surface 21. In a first direction (a direction parallel to the display region, i.e., direction X in FIG. 1), a distance a between the lateral surface of the first back film 5 close to the bending region 11 and a side of the first surface 21 close to the bending region 11 is smaller than or equal to the radius R1 of the arc-shaped surface portion 101. In this way, it is able to ensure the support performance of the support 2, and prevent the bending of the bending region from being adversely affected.

In a possible embodiment of the present disclosure, in order to ensure the support performance of the support 2, in the first direction, the distance a between the side of the first surface 21 close to the first lateral surface 23 and a lateral surface of the first back film close to the bending region 11 is equal to, but not limited to, the radius R1 of the arc-shaped surface portion 101.

In a possible embodiment of the present disclosure, when considering an attachment tolerance, the distance a between the lateral surface of the first surface 21 close to the bending region 11 and the side of the first surface 21 close to the bending region 11 is smaller than or equal to R1—0.03 mm.

In a possible embodiment of the present disclosure, the radius R1 of the arc-shaped surface portion 101 is, but not limited to, 0.11 mm.

It should be appreciated that, in the first direction, the support 2 is exposed to a bending center o of the arc-shaped surface portion 101, i.e., an orthogonal projection of the bending center o of the arc-shaped surface portion 101 onto the support 2 is located on the support 2, so as to ensure the support performance of the support 2.

In a possible embodiment of the present disclosure, an orthogonal projection of a side of the first back film 5 onto the support 2 close to the bending region 11 coincides with an orthogonal projection of a bending start point of the bending region 11 onto the support 2.

The bending start point is a point indicated by a dashed line 200 in FIG. 1.

In a possible embodiment of the present disclosure, a corner formed by the first lateral surface 23 and the first surface 21 is a rounded corner.

The first lateral surface 23 is an oblique surface, and when a blade-like structure is formed between the first lateral surface 23 and the first surface 21, the bending region 11 is easily damaged. In the embodiments of the present disclosure, when the corner formed by the first lateral surface 23 and the first surface 21 is rounded, it is able to prevent the bending region 11 from being damaged.

Figure 3:
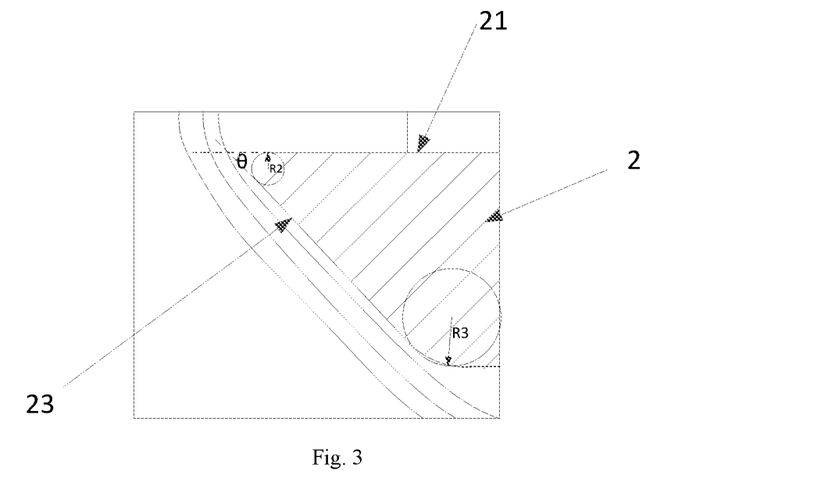
FIG. 3 is another partially enlarged view of the display panel according to one embodiment of the present disclosure.

Referring to FIG. 3, in a possible embodiment of the present disclosure, a radius R2 of the rounded corner formed by the first lateral surface 23 and the first surface 21 is 0.03 mm. Hover, the radius R2 is not limited to 0.03 mm, e.g., it may be 0.02 mm to 0.04 mm.

In a possible embodiment of the present disclosure, a corner formed by the first lateral surface 23 and the second surface 22 is a rounded corner.

Through the rounded corners, it is able to prevent a line extending from the display region 12 to the binding region 131 from being broken.

Referring to FIG. 3, in a possible embodiment of the present disclosure, a corner formed by the first lateral surface 23 and the first surface 21 is a first rounded corner, a corner formed by the first lateral surface 23 and the second surface 22 is a second rounded corner, and a radius R2 of the first rounded corner is smaller than a radius R3 of the second rounded corner.

The first lateral surface 23 is an oblique surface, and in the light-exiting direction of the display substrate (i.e., a direction perpendicular to the first surface), the oblique surfaces is formed by extending a first end of the first lateral surface 23 close to the first surface 21 obliquely in a direction away from the bending region 11, i.e., a second end of the first lateral surface 23 away from the first surface 21 is indented inwardly (in the light-exiting direction of the display substrate 1, an area of an orthogonal projection of the first surface 21 is greater than an area of an orthogonal projection of the second surface 22). An angle between the first lateral surface 23 and the first surface 21 is an acute angle, and an angle between the first lateral surface 23 and the second surface 22 is an obtuse angle, so a blade-like structure is formed between the first lateral surface 23 and the first surface 21. Hence, the corner formed by the first lateral surface 23 and the first surface 21 is rounded to form the first rounded corner so as to prevent the bending region 11 from being damaged, and the corner formed by the first lateral surface 23 and the second surface 22 is rounded to form the second rounded corner so as to prevent the line from being broken.

In a possible embodiment of the present disclosure, a transition region is arranged between the bending region 11 and the binding region 131 along a bending direction of the bending region 11 (i.e., a direction indicated by a curved arrow in FIG. 2), the transition region is provided with an arc-shaped surface, and a bending radius of the transition region is equal to a radius of the rounded corner formed by the first lateral surface and the second surface.

It should be appreciated that, the bending radius of the transition region is set according to the practical needs. However, the bending radius of the transition region may not be too small so as to prevent the line from being broken, and it may not be too large so as to prevent the back film on a side of the second surface 22 away from the first surface 21 from being adversely affected.

In a possible embodiment of the present disclosure, the angle between the first surface 21 and the first lateral surface 23 is 30° to 60°.

Referring to FIG. 3, in a possible embodiment of the present disclosure, the angle θ between the first surface 21 and the first lateral surface 23 is, but not limited to, 45°.

Figure 15:
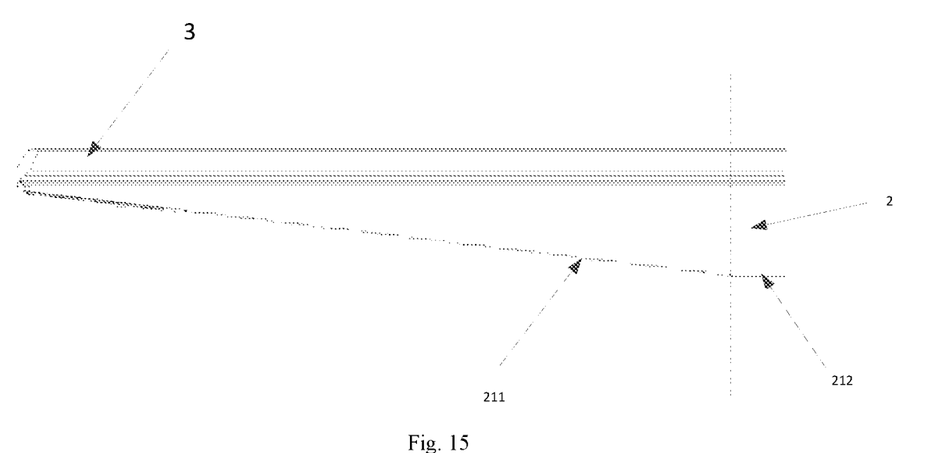
FIG. 15 is another schematic view of the display panel according to one embodiment of the present disclosure.

With reference to FIGS. 1 and 15, in a possible embodiment of the present disclosure, the second surface 22 includes a beveled surface region 211 coupled to the first lateral surface 23 and a planar surface region 212 arranged at a side of the beveled surface region 211 away from the first lateral surface 23, the planar surface region 212 is arranged parallel to the first surface 21, the first surface 21 is arranged parallel to the display region of the display substrate 1, and an angle between the beveled surface region 211 and the first lateral surface 23 is an obtuse angle, i.e., the oblique surface region 211 is formed through extending an end coupled to the first lateral surface 23 in a direction away from the first surface 21. Through the cooperation of the first lateral surface 23 with the oblique surface region 211, it is able to facilitate the formation of the overall shape of the bending region 11.

Figure 4:
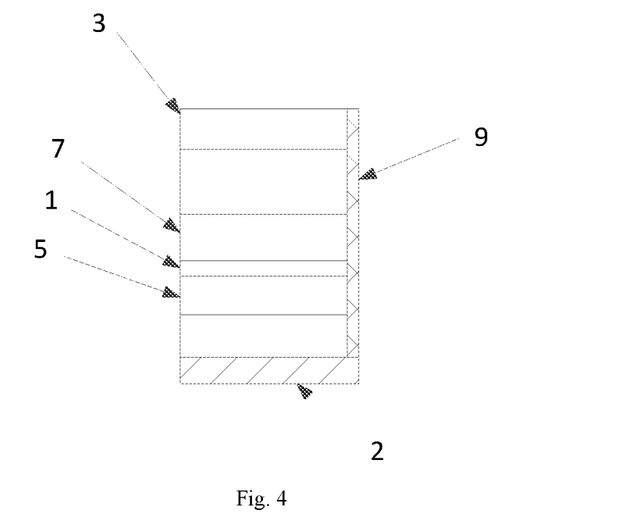
FIG. 4 is yet another partially enlarged view of the display panel according to one embodiment of the present disclosure.
Figure 13:
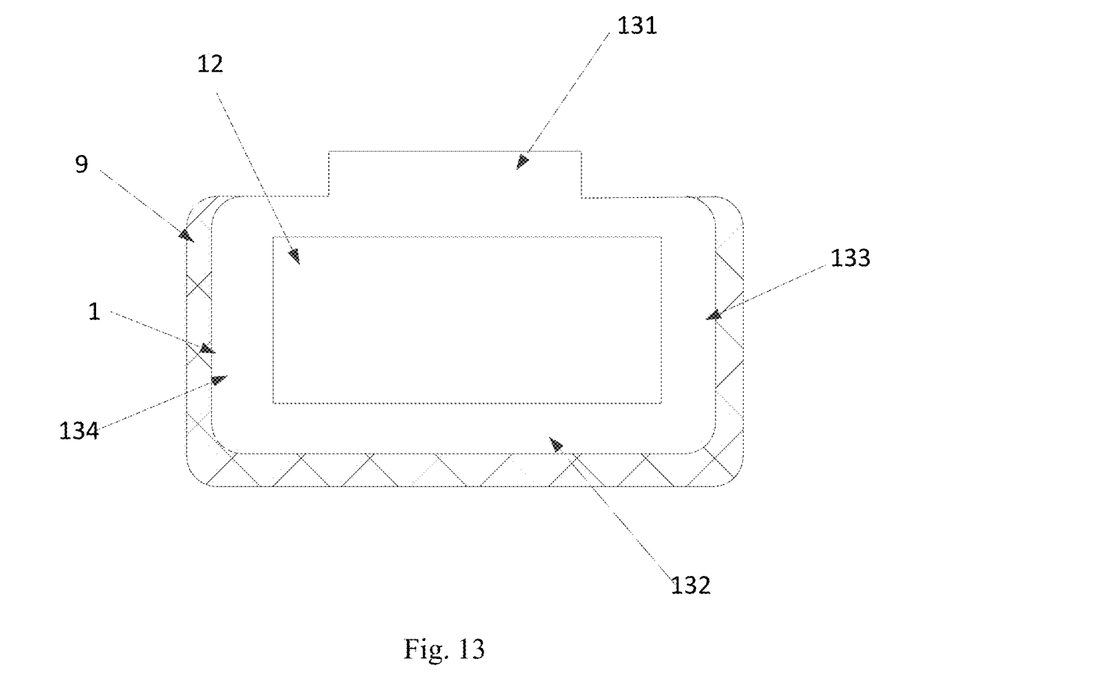
FIG. 13 is a schematic view of the display panel after a frame sealant is arranged according to one embodiment of the present disclosure.

Referring to FIGS. 4 and 13, in a possible embodiment of the present disclosure, the non-display region further includes a first region 132 arranged at a side of the display region away from the binding region 131, and a second region 133 and a third region 134 arranged adjacent to the first region 132. At least one of the first region 132, the second region 133 and the third region 134 includes a first sub-region exposed at a corresponding edge of the display panel.

A lamination structure, e.g., the cover plate 3, is arranged at the light-exiting side of the display substrate 1. Through the first sub-region, the display substrate 1 and the lamination structure are cut along an edge of the first sub-region (it should be appreciated that, a laser edge-finding cutting technique is adopted, i.e., an edge of the support is captured through a CCD image obtaining unit, and then the cutting is performed along a line indented by 30 μm relative to the edge, so as to remove an excessive part (including a part of the display substrate and a part of the lamination structure at the light-exiting side) from a front side of the display panel). In this way, the lamination structure has a regular edge for the extension of the support, so as to protect the display substrate 1 and the lamination structure during the splicing.

It should be appreciated that, in a display device, the cover plate, as an outermost structure, is a biggest factor for determining a bezel of the display device. The support is indented inwardly relative to the cover plate, i.e., an orthogonal projection of the support onto the cover plate is located within the cover plate, so a width of the bezel is not adversely affected by the extension of the support (relative to the lamination structure).

In a possible embodiment of the present disclosure, each of the first region 132, the second region 133, and the third region 134 is provided with the first sub-region to ensure the overall appearance of the display panel.

In a possible embodiment of the present disclosure, a width of the first sub-region is 0.02 mm to 0.04 mm in a direction perpendicular to an extension direction of a corresponding one of the first region 132, the second region 133 and the third region 134.

In a possible embodiment of the present disclosure, the width of the first sub-region is 0.03 mm in the direction perpendicular to the extension direction of the corresponding one of the first region 132, the second region 133 and the third region 134.

With reference to FIGS. 4 and 13, in a possible embodiment of the present disclosure, the cover plate 3 is arranged at the light-exiting side of the display substrate 1, a frame sealant 9 is arranged on the first sub-region, and a surface of the frame sealant 9 away from the first sub-region is flush with a surface of the cover plate 3 away from the display substrate 1.

Through the frame sealant 9, it is able to protect the edge of the display substrate 1. In addition, when the display panels are spliced to form a splicing screen, it is able to prevent the occurrence of any damage caused by collision through the frame sealant 9.

Referring to FIG. 1, in a possible embodiment of the present disclosure, an edge sealant 4 is arranged between the bending region 11 and the cover plate 3, and a side of the edge sealant 4 away from the display region 12 is flush with a corresponding lateral surface of the cover plate 3 in the first direction.

The bending region 11 is bent so that the binding region 131 is bent to a side of the support 2 away from the display substrate 1. The support 2 is arranged at a side corresponding to the binding region 131, and it is different from the structure at a side corresponding to the first region 132, the second region 133 or the third region 134, so it is impossible to extend the support 2 outwardly. However, in order to protect the lateral surface of the display substrate 1, the edge sealant 4 is arranged between the cover plate 3 and the display substrate 1.

Figure 14:
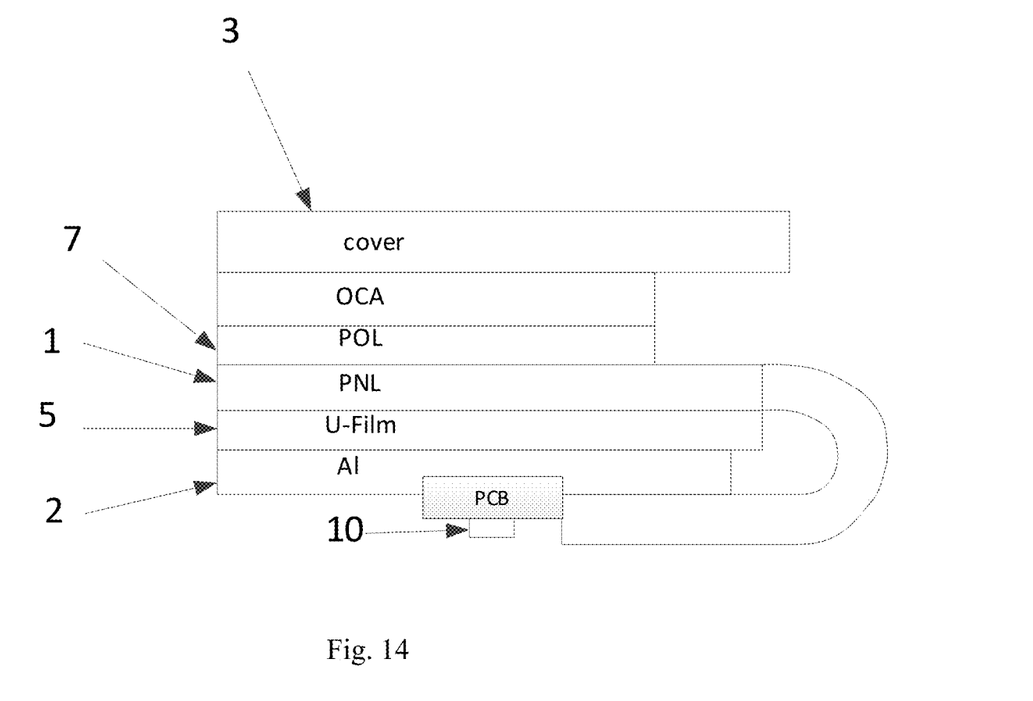
FIG. 14 is a schematic view of the display panel after the display substrate is coupled to a circuit board according to one embodiment of the present disclosure.

Referring to FIG. 14, in a possible embodiment of the present disclosure, a groove for receiving a printed circuit board (PCB) is formed in the second surface 22 at a side away from the first surface 21, and the printed circuit board is coupled to the display substrate 1 through a flexible circuit board.

Through the groove, it is able to reduce a thickness of the display panel in the light-exiting direction.

A size of the groove is set according to a size of the printed circuit board. For example, when the printed circuit board has a size of 60 mm*60 mm, the groove may have a size of 62 mm*62 mm. When the support 2 has a thickness of 4 mm and the printed circuit board has a thickness of 3.5 mm in the light-exiting direction of the display substrate 1, a depth of the groove may be, but not limited to, 0.2 mm to 0.4 mm.

In a possible embodiment of the present disclosure, the depth of the groove is less than the thickness of the printed circuit board in the light-exiting direction of the display substrate 1, such that a part of the printed circuit board is exposed to the support 2. The printed circuit board is coupled to the flexible circuit board, so the display substrate 1 is coupled to the printed circuit board via the flexible circuit board.

It should be appreciated that, in a possible embodiment of the present disclosure, the printed circuit board includes a main body having an outer surface flush with the second surface and a first adapter arranged on the main body portion and coupled to the flexible circuit board, and the first adapter is exposed to the groove to be coupled to the flexible circuit board.

In a possible embodiment of the present disclosure, the support 2 is made of, but not limited to, an aluminum plate.

The manufacture of the display panel will be described hereinafter.

It should be appreciated that, FIGS. 5 to 13 merely illustratively show a position relationship among the layers, but shall not be construed as limiting an actual shape and an actual proportion of each layer.

Figure 5:
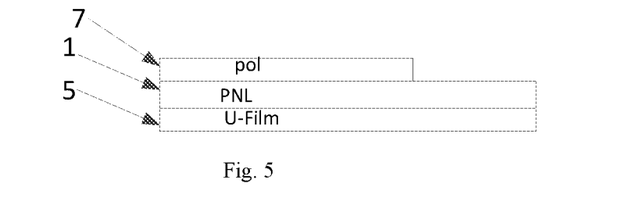
FIG. 5 is a schematic view of the display panel after a polarizer is attached according to one embodiment of the present disclosure.

The attachment of a polarizer: as shown in FIG. 5, the polarizer 7 is attached at the light-exiting side of the display substrate 1, and the first back film 5 is arranged at a backlight side of the display substrate.

Figure 6:
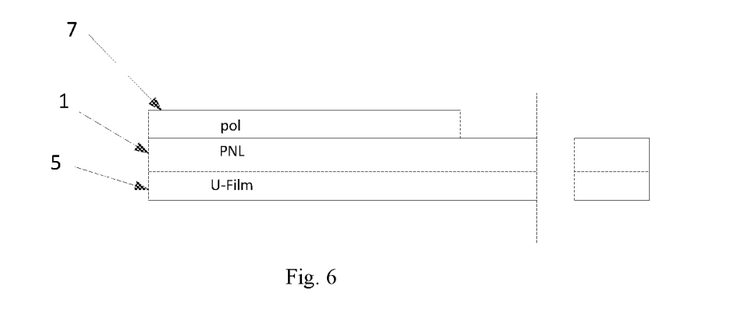
FIG. 6 is a schematic view of the display panel after a binding region is cut according to one embodiment of the present disclosure.

Cutting: as shown in FIG. 6, the display substrate 1 is cut at a side of the binding region, and a dotted box indicates a cut portion of the display substrate.

Figure 7:
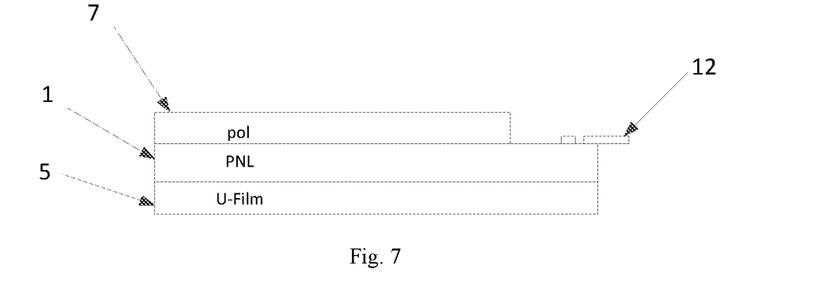
FIG. 7 is a schematic view of the display panel after a flexible circuit board is bound according to one embodiment of the present disclosure.

Binding connection: as shown in FIG. 7, a driving IC and the flexible circuit board 14 are bound to the display substrate.

Figure 8:
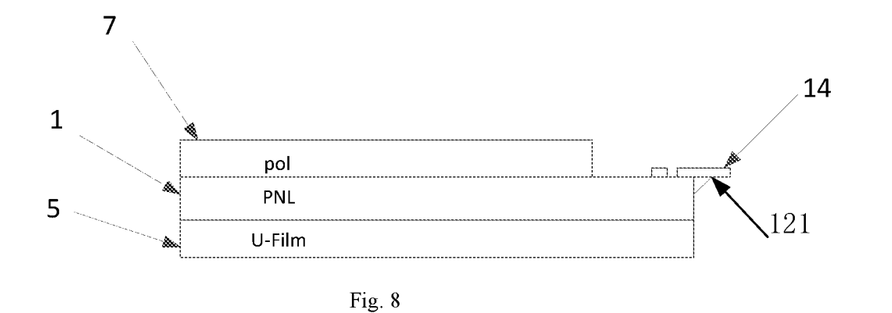
FIG. 8 is a schematic view of the display panel after a protection adhesive is arranged between the flexible circuit board and a display substrate according to one embodiment of the present disclosure.

The application of an adhesive layer: as shown in FIG. 8, a protection adhesive layer 121 is arranged on the flexible circuit board 14 and the display substrate 1, so as to protect the flexible circuit board 14.

It should be appreciated that, both the protection adhesive layer 8 arranged at a side of the bending region 11 away from the support 2 and the protection adhesive layer 121 are formed through UV curing. The protection sealant layer 121 between the flexible circuit board 14 and the display substrate 1 functions as to protect the flexible circuit board 14 from water and oxygen, and it has high modulus so as to have a constant shape. The protection adhesive layer 8 protects the bending region 11, but the protection adhesive layer 8 is formed on the bending region 11 before the bending region 11 is bent and the protection adhesive layer 8 is bent along with the bending region 11. Hence, the protection adhesive layer 8 has low modulus, so as to be flexible.

Figure 9:
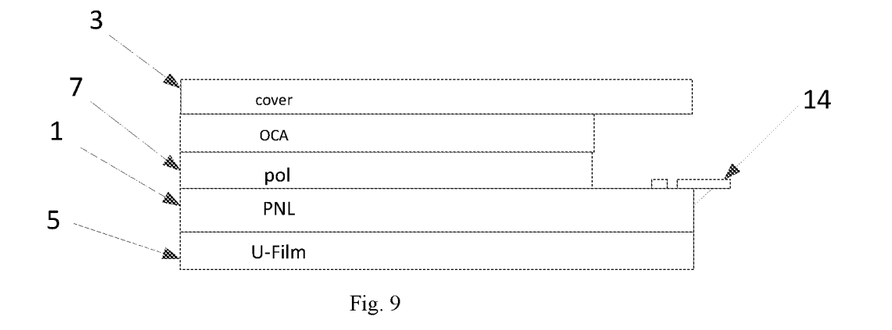
FIG. 9 is a schematic view of the display panel after the assembling of a cover plate according to one embodiment of the present disclosure.

The assembling of the cover plate: as shown in FIG. 9, the cover plate 3 is arranged at a side of the polarizer 7 away from the display substrate 1 through an optical clear adhesive layer.

Figure 10:
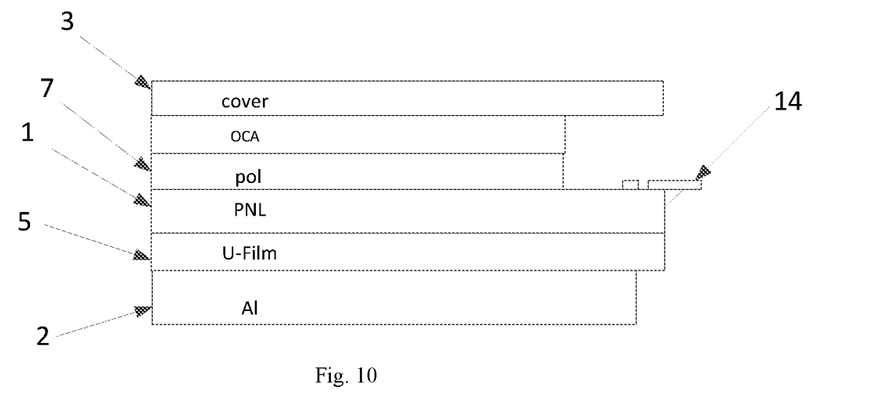
FIG. 10 is a schematic view of the display panel after the assembling of a support according to one embodiment of the present disclosure.

The formation of the support: as shown in FIG. 10, the support made of an aluminum plate or stainless steel is arranged at a side of the first back film 5 away from the display substrate 1.

Figure 11:
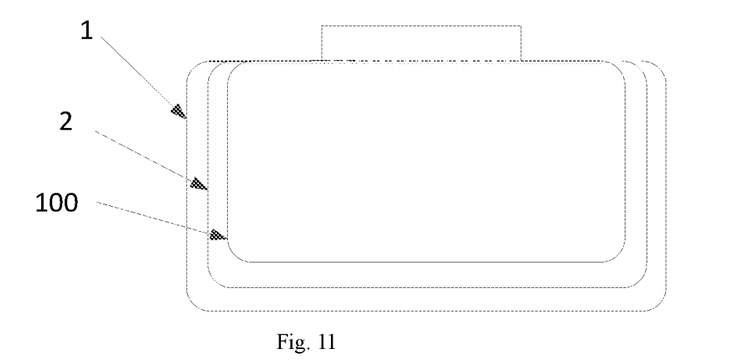
FIG. 11 is a schematic view of the display panel after a non-binding region is cut according to one embodiment of the present disclosure.

Cutting: as shown in FIG. 11, the display substrate is cut at the non-binding region (the first region 132, the second region 133 and the third region 134), where 100 represents a cutting line. The cutting line is arranged at an inner side of the support 2, so that the support extends outward relative to the display substrate at the non-binding region (i.e., the support is provided with the first sub-region). In this step, the cutting is performed along an edge of the support as an alignment mark. To be specific, the alignment mark is captured from a backlight side of the display substrate, and then the cutting is performed from a front side of the display substrate (the display substrate is transparent, so it is able to view the edge of the support from the front side of the display substrate).

Figure 12:
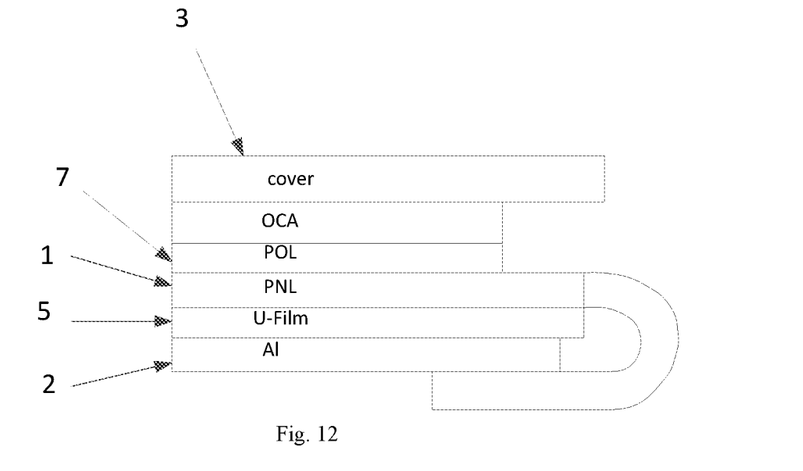
FIG. 12 is a schematic view of the display panel after the display substrate is bent according to one embodiment of the present disclosure.

Bending: as shown in FIG. 12, the bending region is bent (the second back film at a side of the support away from the display substrate is omitted).

The formation of the frame sealant: as shown in FIG. 13, the frame sealant 9 is formed at the non-binding region.

Binding connection of the printed circuit board: as shown in FIG. 14, the flexible circuit board is bound to the printed circuit board.

It should be appreciated that, the above drawings merely illustratively show a position relationship among a part of structures, and they shall not be construed as limiting an actual scale.

The present disclosure further provides in some embodiments a splicing screen, which includes a plurality of the above-mentioned display panels spliced together. Each display panel includes a display substrate 1, the display substrate 1 is coupled to a circuit board via a flexible circuit board, and pins 10 coupled to a main circuit board of the splicing screen are arranged on the circuit board of each display panel.

Through the pins 10, the circuit board of each display panel is coupled to the main circuit board of the splicing screen rapidly, so as to facilitate the replacement of the display panel of the splicing screen.

It should be appreciated that, a groove for receiving the circuit board is formed in the second surface 22 of the support at a side away from the first surface 21, the display substrate 1 is coupled to the circuit board through the flexible circuit board, the circuit board includes a main body and a pin 10 arranged on the main body and coupled to the main circuit board of the splicing screen, and the pin 10 is exposed to the groove so as to be coupled to the main circuit board conveniently.

The present disclosure further provides in some embodiments a display device which includes the above-mentioned display panel, or the above-mentioned splicing screen.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
 a display substrate, the display substrate comprising a display region and a non-display region surrounding the display region, the non-display region comprising a binding region and a bending region arranged between the display region and the binding region; and
 a support arranged at a backlight side of the display substrate,
 wherein the support comprises, along a light-exiting direction of the display substrate, a first surface, a second surface arranged opposite to the first surface, and a first lateral surface arranged between the first surface and the second surface, the first surface is arranged close to the display region, the first lateral surface is covered by the bending region, the first lateral surface is an oblique surface, an angle formed at a junction between the first lateral surface and the first surface is an acute angle, and an angle between the first lateral surface and the second surface is an obtuse angle.

2. The display panel according to claim 1, wherein along a bending direction of the bending region, the bending region comprises an arc-shaped surface portion arranged close to the display region and a beveled surface portion adjacent to the arc-shaped surface portion, and the beveled surface portion is attached to the first lateral surface.

3. The display panel according to claim 2, wherein a radius of the arc-shaped surface portion is less than or equal to 0.14 mm.

4. The display panel according to claim 2, wherein a first back film is arranged between the display substrate and the first surface, a distance between a lateral surface of the first back film close to the bending region and a side of the first surface close to the bending region in a first direction is greater than or equal to the radius of the arc-shaped surface portion, the first direction is a direction from the display region to the binding region, and the first direction is parallel to the display region.

5. The display panel according to claim 2, wherein a corner formed by the first lateral surface and the first surface is a rounded corner.

6. The display panel according to claim 2, wherein a corner formed by the first lateral surface and the second surface is a rounded corner.

7. The display panel according to claim 6, wherein a transition region is arranged between the bending region and the binding region along a bending direction of the bending region, the transition region is provided with an arc-shaped surface, and a bending radius of the transition region is equal to a radius of the rounded corner formed by the first lateral surface and the second surface.

8. The display panel according to claim 2, wherein a corner formed by the first lateral surface and the first surface is a first rounded corner, a corner formed by the first lateral surface and the second surface is a second rounded corner, and a radius of the first rounded corner is smaller than a radius of the second rounded corner.

9. The display panel according to claim 1, wherein an angle between the first surface and the first lateral surface is 30° to 60°.

10. The display panel according to claim 1, wherein the non-display region further comprises a first region arranged at a side of the display region away from the binding region, and a second region and a third region arranged adjacent to the first region, and at least one of the first region, the second region and the third region comprises a first sub-region exposed at a corresponding edge of the display panel.

11. The display panel according to claim 10, wherein a width of the first sub-region is 0.02 mm to 0.04 mm in a direction perpendicular to an extension direction of a corresponding one of the first region, the second region, and the third region.

12. The display panel according to claim 10, wherein a cover plate is arranged at the light-exiting side of the display substrate, a frame sealant is arranged on the first sub-region, and a surface of the frame sealant away from the first sub-region is flush with a surface of the cover plate away from the display substrate.

13. The display panel according to claim 12, wherein an edge sealant is arranged between the bending region and the cover plate, a side of the edge sealant away from the display region is flush with a corresponding lateral surface of the cover plate along a first direction, the first direction is a direction from the display region to the binding region, and the first direction is parallel to the display region.

14. The display panel according to claim 1, wherein a groove for receiving a circuit board is formed in the second surface at a side away from the first surface, and the display substrate is coupled to the circuit board via a flexible circuit board.

15. The display panel according to claim 14, wherein a depth of the groove is less than a thickness of the circuit board in the light-exiting direction of the display substrate so that a part of the circuit board is exposed to the support.

16. The display panel according to claim 1, wherein the support is made of an aluminum plate.

17. A splicing screen, comprising a plurality of the display panels according to claim 1 spliced together, wherein each display panel comprises a display substrate, the display substrate is coupled to a circuit board via a flexible circuit board, and pins configured to electrically connect to a main circuit board of the splicing screen are formed on the circuit board of the display panel.

18. The splicing screen according to claim 17, wherein along a bending direction of the bending region, the bending region comprises an arc-shaped surface portion arranged close to the display region and a beveled surface portion adjacent to the arc-shaped surface portion, and the beveled surface portion is attached to the first lateral surface.

19. The splicing screen according to claim 18, wherein a radius of the arc-shaped surface portion is less than or equal to 0.14 mm.

20. A display device, comprising the display panel according to claim 1, or comprising a splicing screen which comprises a plurality of the display panels.

* * * * *